United States Patent
Uesaka et al.

(10) Patent No.: US 7,483,459 B2
(45) Date of Patent: Jan. 27, 2009

(54) LASER DRIVER WITH SELECTABLE OUTPUT IMPEDANCE

(75) Inventors: Katsumi Uesaka, Kanagawa (JP); Keiji Tanaka, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/583,039

(22) Filed: Oct. 19, 2006

(65) Prior Publication Data

US 2007/0098026 A1 May 3, 2007

(30) Foreign Application Priority Data

Oct. 19, 2005 (JP) .............................. 2005-304724

(51) Int. Cl.
*H01S 3/00* (2006.01)
*H01S 3/04* (2006.01)

(52) U.S. Cl. ..................................... 372/38.02; 372/34
(58) Field of Classification Search .............. 372/29.01, 372/34, 38.02
See application file for complete search history.

(56) References Cited

U.S. PATENT DOCUMENTS 6,697,205 B2 * 2/2004 Cyrusian et al. .............. 360/68

2002/0027456 A1 * 3/2002 Barrow ........................ 327/110
2004/0114650 A1 * 6/2004 Tanaka et al. ............ 372/38.02

FOREIGN PATENT DOCUMENTS

JP      2004-047832 A      2/2004
JP      2004-193489 A      7/2004

OTHER PUBLICATIONS

Analog Devices, "10.7 Gbps Active Back-Termination, Differential Laser Diode Driver" (ADN2525), pp. 1-16, 2006.
Maxim, "155Mbps to 2.5 Gbps Burst-Mode Laser Driver" (MAX3656), pp. 1-16, 2005.

* cited by examiner

*Primary Examiner*—Minsun Harvey
*Assistant Examiner*—Patrick Stafford
(74) *Attorney, Agent, or Firm*—Venable LLP; Michael A. Sartori; Kyle D. Petaja

(57) ABSTRACT

The present invention is to provide a laser driver able to select configurations for the high speed application and for the lower speed and the lower power dissipation. The laser driver of the present invention provides a pair of transistors with the differential configuration whose outputs are complementary to each other, and a pair of load circuits connected between respective outputs of the paired transistor and the power supply line. Two outputs of the paired transistor are also connected to the anode and cathode of the laser diode and two load circuits each includes a switch to isolate the output of the transistor from the power supply line to vary the output impedance of the laser driver.

11 Claims, 6 Drawing Sheets

LASER DRIVER WITH SELECTABLE OUTPUT IMPEDANCE

BACKGROUND OF THE INVENTION

1. Field of the Invention

The present invention relates to a driver circuit for driving a semiconductor laser diode.

2. Related Prior Art

Along with the diffusing of the internet, the optical communication becomes very popular in various fields to transmit huge information and the requirements for the optical transmitter becomes complex and diverse. For example, the trunk line in the telecommunication or the large area network (LAN) request the high speed modulation to transmit the huge information, while the access network is necessary for the bust mode communication to realize the one-to-N (1:N) protocol. Generally, the laser driver for driving the semiconductor laser diode is optimized in the individual communication protocol. In the application for the high speed communication, in order to prevent the degradation of the signal quality due to the impedance mismatching between the semiconductor laser and the laser driver, the laser driver adjusts the output impedance thereof with the transmission impedance by providing a termination resistor to reduce the reflection of the high frequency signal at the output as shown in the Japanese patent published as 2004-193489A and 2004-047832A. The termination resistor for the impedance matching is necessary to be connected immediately to the collector of the output transistor of the laser driver. Particularly, it is quite preferable for the termination resistor to be built within an integrated circuit of the laser driver for the application that requires the high speed modulation. For the application that requires the burst mode transmission, the laser diode is necessary to be directly coupled with the laser driver. When the modulation speed is slow such that the reflection due to the impedance mismatching between the laser diode and the laser driver does not degrade the signal quality, it is usual to omit the termination resistor in the output terminal to match the impedance with the transmission line and the laser diode in order to reduce the power dissipation by eliminating the void current.

Thus, the optimized configuration of the output characteristic, in particular, the output impedance of the laser driver depends on each application. The application in the high speed modulation is necessary to build in the termination resistor for the impedance matching, while, the application in the low speed and the lower power dissipation, or the application for the burst mode transmission, the termination resistor is preferable to be taken off. Conventionally, the laser driver for the high speed application and that for the lower speed application are individually prepared.

The present invention is to provide a laser driver in which the configuration for the high speed application and that for the lower speed application may be selectable.

SUMMARY OF THE INVENTION

One aspect of the present invention relates to a configuration of the laser driver that comprises a pair of transistors operated in a differential mode and a pair of load circuits. Each transistor has an output, one of which is coupled with an anode of the laser diode while, the other of which is coupled with the cathode of the laser diode. Each of load circuits is connected between the output of the paired transistor and a power supply line. The load circuit includes at least one resistor and one switch connected in serial to the resistor. The switch isolates the output of the paired transistor from the power supply line depending on the condition whether the output is coupled with the laser diode in the AC mode or in the DC mode.

According to the present invention, when the output of the laser driver is coupled with the laser diode in the DC mode, the switch in the load circuit is turned off to isolate the output from the power supply line, while, when the output is coupled with the laser diode in the AC mode, the switch is turned on to terminate the output by the resistor connected in serial to the switch. Thus, in the AC mode, the output may be terminated by the composite resistance of the resistor and the on-resistance of the switch that reduces the degradation of the driving signal due to the reflection of the signal by the termination resistor. While, in the DC mode, the load resistance for the output of the paired transistor becomes the laser diode only, in which the power consumption of the laser driver may be reduced.

The switch in the load circuit may be a transistor switch that can be controlled in analog for the on-resistance thereof. Thus, when the laser driver is built in the integrated circuit, the dispersion of the load resistance for the paired transistor may be compensated.

The load circuit may include a plurality of combinations with a resistor and a switch connected in serial to the resistor. The combination of switches that turns on may be controlled in digital depending on the temperature of the laser diode. The switches may be also controlled in analog to compensate the termination resistance.

Another aspect of the present invention relates to a method for driving the laser diode by the laser driver that includes a pair of transistors operated in a differential mode and a pair of lord units. Each transistor has an output coupled with the laser diode and an input to receive a driving signal. Each load unit is connected between the output of the paired transistor and a power supply line. The method comprises steps of; (1) setting a condition of the load unit depending on a coupling configuration between the laser driver and the laser diode, and (2) supplying the driving signal complementary to each other to respective inputs of the transistors. That is, when the outputs of the transistor are directly coupled with the laser diode in the DC mode, the load unit isolates the output from the power supply line, while, the outputs of the transistor are indirectly coupled with the laser diode in the AC mode via coupling capacitors, the load unit connects the output to the power supply line to terminate the output.

DESCRIPTION OF PREFERRED EMBODIMENTS

Figure 1:
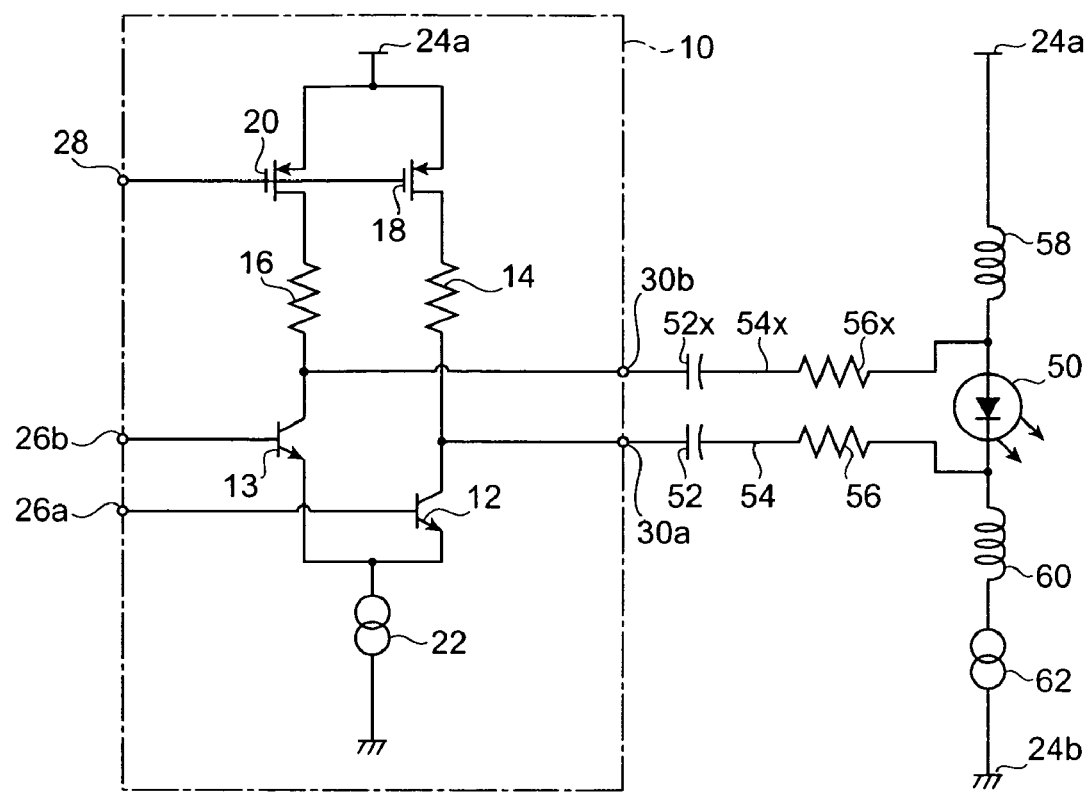
FIG. 1 is a circuit diagram showing a driver for a semiconductor laser diode according to the first embodiment of the present invention, where the laser diode is coupled with the driver in an AC mode.

Next, preferred embodiments of the present invention will be described as referring to accompanying drawings. In the drawings, the same or equivalent elements will be referred by the same numerals or symbols without overlapping explanations.

First Embodiment

Figure 2:
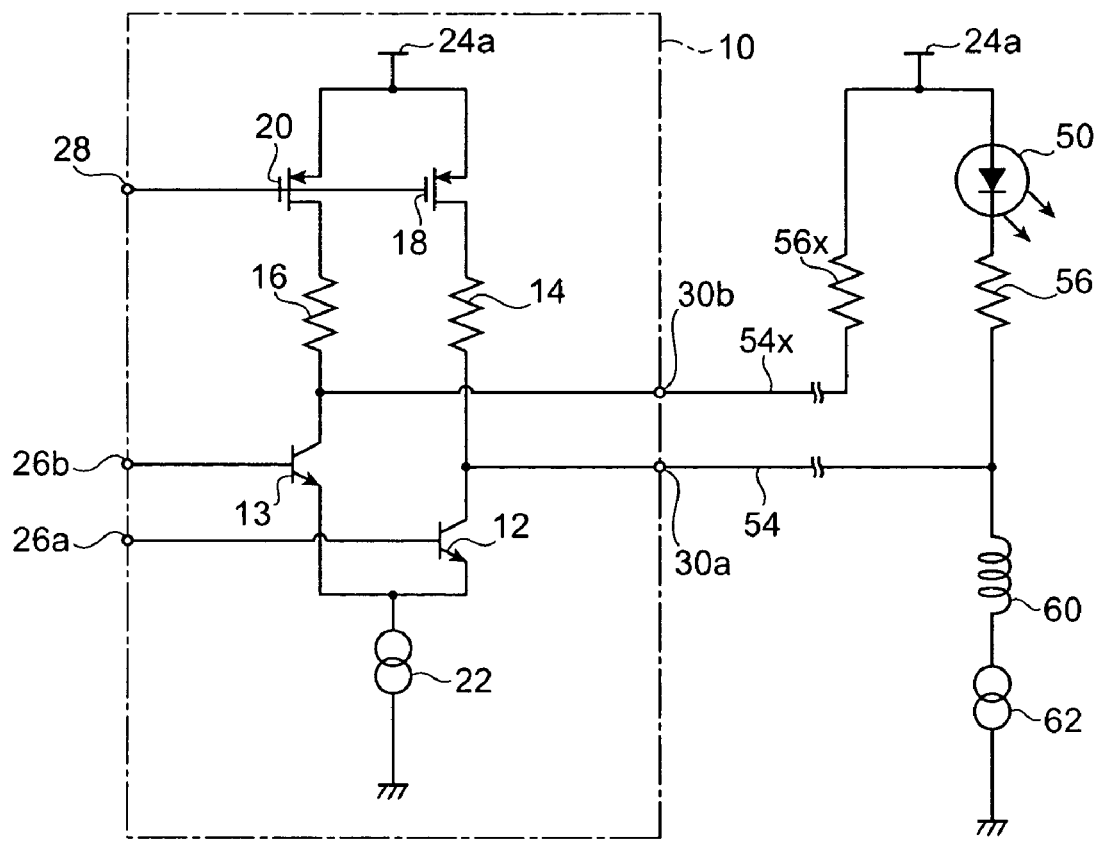
FIG. 2 is a circuit diagram showing a driver for a semiconductor laser diode according to the first embodiment of the present invention, where the laser diode is coupled with the driver in a DC mode.

FIGS. 1 and 2 show a laser driver for driving a semiconductor laser diode according to the first embodiment of the present invention. In FIG. 1, the laser driver 10 couples with the laser diode 50 with an AC mode, while, in FIG. 2, the laser driver 10 couples with the laser diode 50 in a DC mode. Switching transistors 18 and 20 in FIG. 1, which is connected to transistors, 12 and 13, as a collector load, turn on in the AC mode operation, while, transistors 18 and 20 in FIG. 2 may be turned off in the DC mode operation.

The operation of the laser driver 10 will be described as referring to FIG. 1. The laser driver 10 includes first and second transistors, 12 ad 13, first and second resistors, 14 and 16, and first and second switching transistors, 18 and 20. The base of the transistors, 12 and 13, are coupled with respective input terminals, 26a and 26b. The collectors are guided to respective output terminals, 30a and 30b, and the emitters are connected to the current source 22. The input terminals, 26a and 26b, receive signals complementary to each other, and another input terminal 28 receives a control signal to control the switching transistors, 18 and 20. The complementary output terminals, 30a and 30b, are coupled with respective transmission lines, 54 and 54x, via coupling capacitors, 52 and 52x. The transmission lines, 54 and 54x, are connected to termination resistors, 56 and 56x, while the other ends of the termination resistors, 56 and 56x, are connected to the anode and cathode of the laser diode 50. Thus, the laser driver 10 according to the present embodiment may drive the laser diode 50 in a differential mode.

The termination resistors, 56 and 56x, are provided in order to compensate the impedance mismatching between the laser diode 50 and the transmission lines, 54 and 54x, because the impedance of the laser diode 50 between the anode and the cathode thereof is smaller than the characteristic impedance of the transmission liens, 54 and 54x.

The anode of the laser diode 50 is connected to the power supply 24a via a inductor 58, while the cathode thereof is grounded via another inductor 60 and the current source 62. This current source 62, which provides a constant current, supplies a bias current to the laser diode 50. Two inductors, 58 and 60, are provided to prevent the driving signal applied to the laser diode 50 from leaking to the power supply 24a and the current source 62, which reduces the degradation of the performance of the laser diode 50.

In the circuit shown in FIGS. 1 and 2, the resistance of the resistors, 14 and 16, are set to a composite impedance of the termination resistors, 56 and 56x, and a half of the impedance of the laser diode 50.

Where, the resistance of the resistors, 14 and 16, and the composite impedance of the termination resistors, 56 and 56x, and a half of the impedance of the laser diode 50 are preferable to be equal to the characteristic impedance of the transmission lines, 54 and 54x, respectively.

The first and second switching transistors, 18 and 20, are constituted by a p-type MOS transistor with drains thereof each connected to the first and second resistors, 14 or 16, and sources connected to the power supply line 24a. The MOS transistors, 18 and 20, shown in FIG. 1 are configured to be turned on.

The circuit diagram shown in FIG. 2 has different features from that of FIG. 1 in points that the outputs, 30a and 30b, of the laser driver 10 that is complementary to each other are connected to the transmission lines, 54 and 54x, without coupling capacitors, 52 and 52x, and that the inductor 58 is eliminated. This laser driver 10 shown in FIG. 2 may reduce the current which does not contribute the laser operation by turning the switching transistors, 18 and 20, off connected to the collectors via the resistors, 14 and 16.

Next, the operation of the laser driver 10 according to the first embodiment will be described. In FIG. 1, when the transistor 12 is turned on while the other transistor 13 is turned off, the forward current I1 flowing in the laser diode 50 becomes;

$$I_1 = I_B + (R_B \times I_M - V_F)/(2 \times R_B + 2 \times R_D + R_{LD}) \quad (1),$$

where $R_B$ is the composite resistance of the resistor 14 and the switching transistor 18 in the conductive mode and the composite resistance of the resistor 16 and that of the switching transistor 20 in the conductive mode, $R_D$ is the resistance of the resistors, 56 and 56x, $R_{LD}$ is the impedance of the laser diode 50, which may be the junction resistance of the laser diode, $V_F$ is the forward voltage, $I_M$ is the current defined by the current source 22 connected to the common emitter of the transistors, 12 and 13, and $I_B$ is the bias current of the laser diode 50 supplied from the current source 62. On the other hand, when the transistor 12 is turned off while the other is turned on, the forward current I2 flowing in the laser diode 50 becomes;

$$I_2 = I_B - (R_B \times I_M - V_F)/(2 \times R_B + 2 \times R_D + R_{LD}) \quad (2).$$

Therefore, inputting the signals complementary to each other into the paired inputs, 26a and 26b, the modulation current shown below will be generated;

$$I_1 - I_2 = R_B \times I_M/(R_B + R_D + R_{LD}/2) \quad (3).$$

When the laser driver 10 directly, without coupling capacitors, couples with the laser diode 50 and the switching transistors, 18 and 20, are turned off, the current from the current source 22 may be reduced by a co-efficient of $R_B \times I_M/(R_B + R_D + R_{LD}/2)$ compared with the laser driver shown in FIG. 1 that couples with the laser diode in the AC mode via the coupling capacitors because the modulation current flowing in the laser diode 50 becomes $I_M$, which shows an advantage in the power consumption.

The laser driver 10 according to the present embodiment, externally inputting a control signal with the low level into the control terminal 28, namely, the gate of the switching transistors, 18 and 20, the outputs of the transistors, 12 and 13, may be terminated by the composite resistors of the first and second resistors, 14 and 16, and the first and second switching transistors, 18 and 20 only by the resistors, 56 and 56x, because the switching transistors, 18 and 20, may be turned on. Accordingly, the laser driver 10 may match the output impedance thereof to the transmission impedance connecting the laser driver 10 to the laser diode 50 even when the connection between the driver 10 and the laser diode 50 is in the AC mode. Further, externally inputting the control signal with the high level into the control terminal, namely, control terminals of the switches, 18 and 20, the outputs of the laser driver 10 are terminated because the switches, 18 and 20, are turned off. Accordingly, the laser driver 10 may reduce the current not provided to the laser diode 50 when the laser driver 10 is coupled with the laser diode 50 in the DC mode without the coupling capacitors. Thus, the laser driver 10 can choose the configuration between the AC mode preferable in the high speed modulation and the DC mode preferable in the transmission of the burst signal with relatively lower power consumption.

Generally, when the laser driver 10 is installed in the integrated circuit, namely, realized on the semiconductor wafer, the resistance of resistors inevitably shows the dispersion of about ±20% because of the scattering of the process parameters. However, the laser driver 10 of the present embodiment, the output impedance of the complementary outputs thereof may be matched to the predetermined impedance even when the resistance of the first and second resistors, 14 and 16, show some dispersion because, by providing the control signal to the switching transistors, 18 and 20, with an analogue level between the low and high levels of the digital signal, the resistance of the switching transistors, 18 and 20, in the conductive mode can be varied continuously. Therefore, the laser drive 10 may match the impedance between the laser driver 10 and the laser diode 50 even when the manufacturing process has some dispersion in the processing parameters, which may reduce the degradation in the waveform of the signal provided in the laser diode 50.

Second Embodiment

Figure 3:
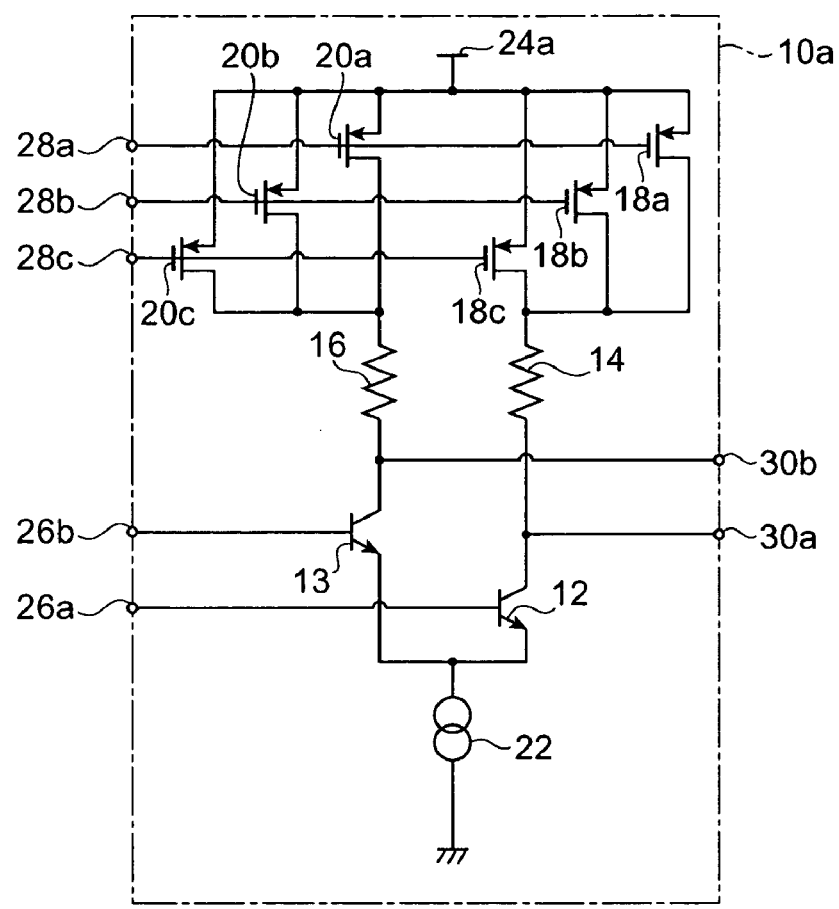
FIG. 3 is a circuit diagram showing another driver according to the second embodiment of the present invention.

FIG. 3 shows the second embodiment of the laser driver 10a according to the present invention. The laser driver 10a has a different feature from the first embodiment shown in previous figures in points that the laser driver 10a provides a plurality of control terminals, 28a to 28c, instead of the terminal 28 of the first embodiment, three switching transistors, 18a to 18c, connected in parallel to each other, instead of the first switching transistor 18, and another three switching transistors, 20a to 20c, connected in parallel instead of the second switching transistor 20. Other configurations of the second laser driver 10a are the same with those appeared in the first embodiment.

When the laser driver 10a connects the laser diode 50 in the DC mode, all switches, 18a to 18c and 20a to 20c, are turned off. On the other hand, the laser driver 10a connects the laser diode 50 in the AC mode via the capacitors, and the control signals applied in the control terminals, 28a to 28c, may adjust the load impedance of the transistors, 12 and 13.

The first switching transistors, 18a to 18c, and the second switching transistors, 20a to 20c, may be a p-type MOS transistor in the present embodiment. The drains, which is the first terminal, of the transistors, 18a to 18c, and those of the transistors, 20a to 20c, are connected to the resistors, 14 and 16, respectively, the sources, which is the second terminal, of the transistors, 18a to 18c and 20a to 20c, are connected to the power supply 24a. Moreover, the gate, which is the control terminal, of the transistors, 18a to 18c, and 20a to 20c, are externally provided with the first to third control signals via the control terminals, 28a to 28c, respectively.

The MOS transistor inherently has the resistance between the drain and source thereof, which is called as the on-resistance, accordingly, the number of transistors that turns on among transistors connected in parallel to each other may determine the composite impedance with the resistor 14. For example, assuming the transistors, 18a to 18c, in FIG. 3 have gate widths different from each other, to select the transistor that turns on may vary the composite impedance with the resistor 14. Moreover, the combination of transistors that turn on may widen the range of the composite impedance, which enhances the accuracy of the adjustment of the impedance-matching. Thus, the laser driver 10a of the present embodiment has the similar function with the laser driver 10 of the previous embodiment, and moreover, the laser driver 10a may vary and adjust the output impedance thereof.

Third Embodiment

Figure 4:
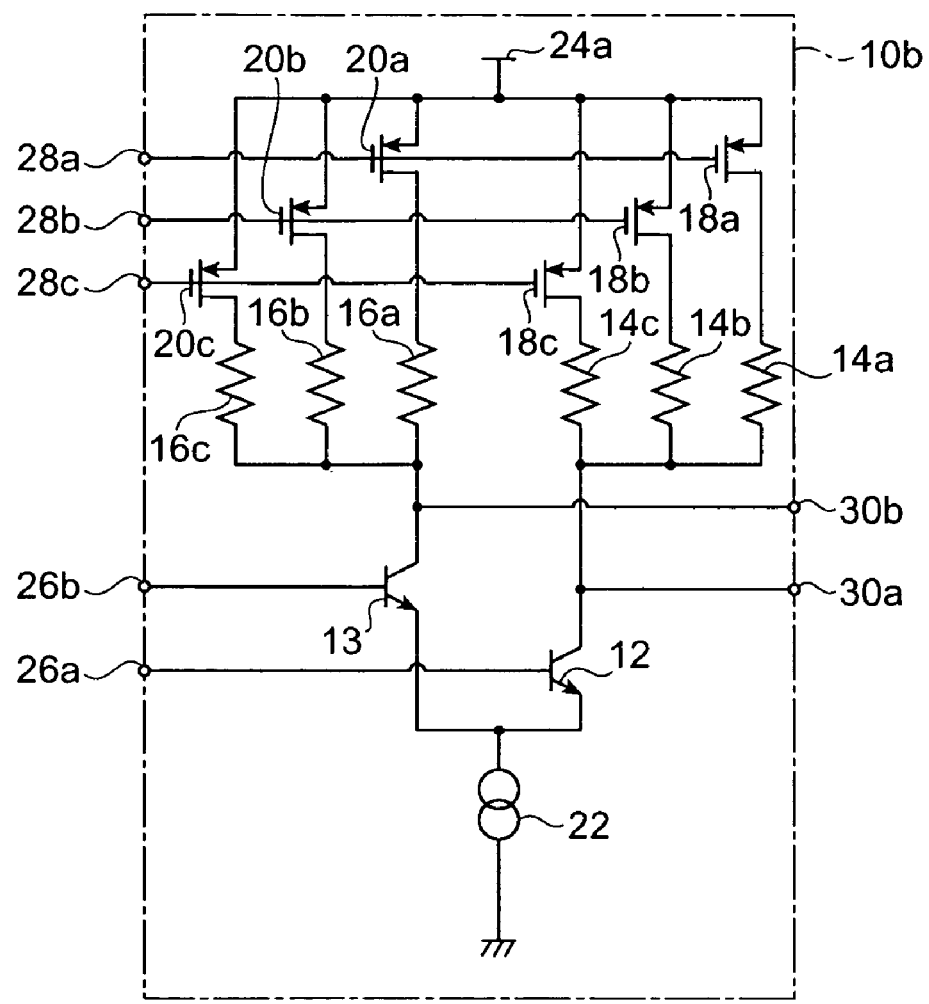
FIG. 4 is a circuit diagram showing still another driver according to the third embodiment of the present invention.

FIG. 4 is a circuit diagram of the laser driver 10b according to the third embodiment of the invention. The laser driver 10b has a different configuration in providing three resistors, 14a to 14c, substituted for the first resistor 14, and another three resistors, 16a to 16c, substituted for the second resistor 16 in the previous embodiments. Other configurations in the laser driver 10b are same with those of the second embodiment.

Each of the first resistors, 14a to 14c, is connected to the collector of the first transistor 12, while the other terminal of each resistor, 14a to 14c, is connected to the corresponding switching transistors, 18a to 18c. The first switching transistors, 18a to 18c are constituted of the p-type MOS transistor. The drains of the transistors, 18a to 18c, are connected to the corresponding resistors, 14a to 14c, the sources thereof are connected to the power supply 24a, and the gates receive respective control signals from the outside of the laser driver.

Each of the second resistors, 16a to 16c, are connected to the collector of the second transistor 13, while the other terminals of the second resistors, 16a to 16c, are connected to the corresponding switching transistors, 20a to 20c. The transistors, 20a to 20c, are also constituted of the p-type MOS transistors. The drains of these transistors, 20a to 20c, are connected to one terminal of respective resistors, 16a to 16c, the sources thereof is connected to the power supply 24a, and the gates receives the control signals from the outside of the laser driver 10b via respective terminals, 28a to 28c.

Next will explain the operation of the laser driver 10b. When the laser driver 10b is coupled with the laser diode 50 in the DC mode, which is similar to the configuration shown in FIG. 2, the control terminals, 28a to 28c, receives control signal with the high level that turns off all transistors, 18a to 18c and 20a to 20c, not to terminate both outputs, 30a and 30b, within the laser driver 10b, which may reduce the waste current not supplied to the laser diode 50.

When the laser driver 10b is connected with the laser diode 50 in the AC mode similar to those shown in FIG. 1, the terminals, 28a to 28b, receive the first to third control signals to turn on or off respective transistors, 18a to 18c and 20a to 20c.

The laser driver 10b of the present embodiment, at least one of first switching transistors, 18a to 18c, and one of second switching transistors, 20a to 20c, are turned on by setting one of terminals, 28a to 28c, to the low level, which terminates the outputs, 30a and 30b, of the laser driver 10b by one of the first resistors, 16a to 16c, and one of the second resistors, 20a to 20c, respectively. Accordingly, the laser driver 10b may match the output impedance thereof even when the driver 10b is coupled with the laser diode 50 in the AC mode.

Moreover, the laser drive 10b of the present embodiment, the composite impedance of the first resistors, 14a to 14c, with the first switching transistors, 18a to 18c, and that of the second resistors, 16a to 16c, with the second switching transistors, 20a to 20c, may be adjustable because three connections, the first resistor 14a and the first switching transistor 18a, the first resistor 14b and the first switching transistor 18b, and the first resistor 14c and the first switching transistor 18c, are connected in parallel, and another three connections, namely, the second resistor 16a and the second switching transistor 20a, the second resistor 16b and the second switching transistor 20b, and the second resistor 16c and the second switch 20b, are also connected in parallel.

Specifically, assuming the resistance of resistors, 14a to 14c and 16a to 16c, are R and the impedance between the drain and the source of transistors, 18a to 18c and 20a to 20c, are Rds, the composite impedance of the first resistors, 14a to 14c, with the first switching transistors, 18a to 18c, and that of the second resistors, 16a to 16c, with the second switching transistors, 20a to 20c, become (R+Rds), (R+Rds)/2, and (R+Rds)/3, when one, two, and three switches are turned on, respectively.

Thus, the laser driver 10b of the present embodiment may adjust the composite impedance of the first resistors, 14a to 14c, with the first switching transistors, 18a to 18c, and that of the second resistors, 16a to 16c, with the second switching transistors, 20a to 20c, by adjusting the combination of the low levels of the first to third control signals to turn on the transistors, 18a to 18c and 20a to 20c. The laser driver 10b, when the driver is coupled with the laser diode in the AC mode, may match the output impedance thereof by changing the combination of the control signal with the low level even when respective resistors, 14a to 14c and 16a to 16c, show some variation in the resistance thereof due to the manufacturing process.

Fourth Embodiment

Figure 5:
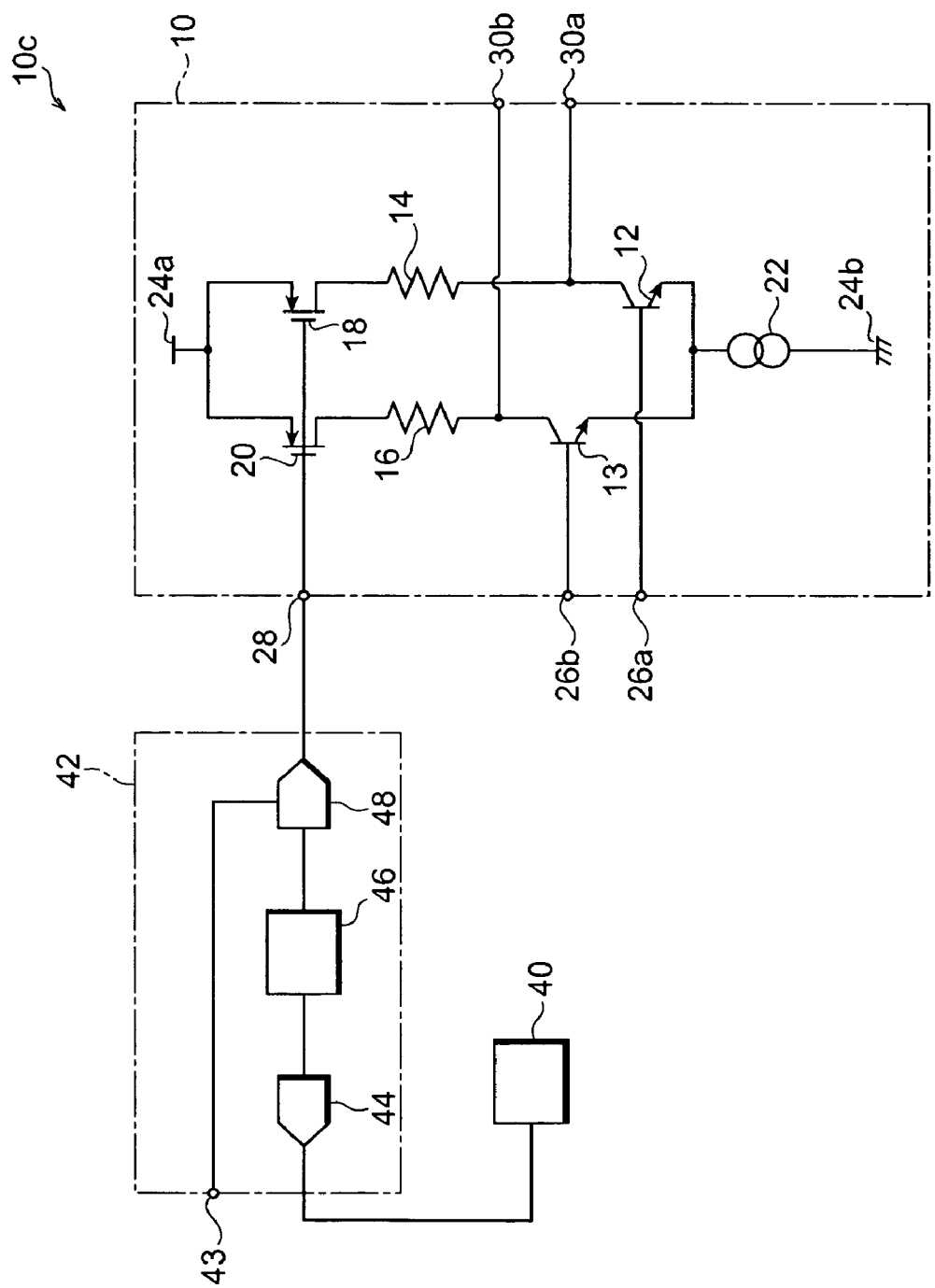
FIG. 5 is a circuit diagram of a driver according to the fourth embodiment of the present invention.

FIG. 5 is a diagram of the laser driver 10c according to the fourth embodiment of the present invention. The laser driver 10c provides a block 40 for monitoring the temperature and the controller 42 in addition to the configuration of the laser driver 10 of the first embodiment.

The block 40 includes a temperature sensor, such as thermistor. The block 40 outputs a sensed signal that reflects the temperature of the laser diode to the controller 42. The controller 42 provides another input 43 to receive the control signal from the outside of the driver 10c. The controller 42, depending on the sensed signal from the block 40 and the control signal, adjusts the output thereof. The controller 42 includes an analog-to-digital converter (A/D-C) 44, a memory 46, and a digital-to-analog converter (D/C-C) 48.

The A/D-C 44 generates a first digital signal corresponding to the sensed signal received from the block 40. The memory 46 generates the second digital signal that corresponds to the first digital signal. The memory operates as a look-up-table to generate the control signal to adjust the output impedance of the laser driver depending on the temperature of the laser diode.

The D/A-C 48 receives the second digital signal from the memory 46 and the control signal from the outside via the input terminal 43. In the present embodiment, the control signal defines the turning-on or turning-off of the switching transistors, 18 and 20, while the signal from the memory 46 adjusts the resistance between the drain and source of the transistor, 18 or 20, when the transistor is turned on by the control signal.

As shown in FIG. 2, when the laser driver 10c is coupled with the laser diode 50 in the DC mode, and the input terminal 42 in the controller 43 receives the control signal with the high level, the D/A-C 48 generates the control signal with the high level. Inputting the control signal with the high level in the terminal 28, the switching transistors, 18 and 20, are turned off, which isolates the paired transistors, 12 and 13, from the power supply 24a to enable the driver 10c to drive the laser diode 50 similar to the first embodiment.

On the other hand, when the laser driver 10c is coupled with the laser diode 50 in the AC mode as shown in FIG. 1, the terminal 43 in the controller 42 receives the control signal with the low level, and the D/A-C 48 generates an analog signal by responding to this control signal. Receiving this analog signal at the input terminal 28, which turns on the switching transistors, 18 and 20, with the on-resistance thereof depending on the level of the analog signal, the laser driver 10c may drive the laser diode 50 as shown in the first embodiment.

Thus, the laser driver 10c of the present embodiment has advantages similar to those shown in the first laser driver 10 and other advantages explained below: the laser driver 10c of the present embodiment may adjust the composite impedance of the first resistor 14 with the first switching transistor 18 and that of the second resistor 16 with the second switching transistor 20 depending on the temperature of the laser diode when the laser driver 10c is coupled with the laser diode in the AC mode because the impedance between the drain and the source of transistors, 18 and 20, are adjustable as the temperature of the laser diode changes. Accordingly, the laser driver 10c may automatically adjust the output impedance thereof even when the impedance of the laser diode varies as the temperature thereof varies, which prevents the degradation of the driving signal supplied to the laser diode from the laser driver.

Fifth Embodiment

Figure 6:
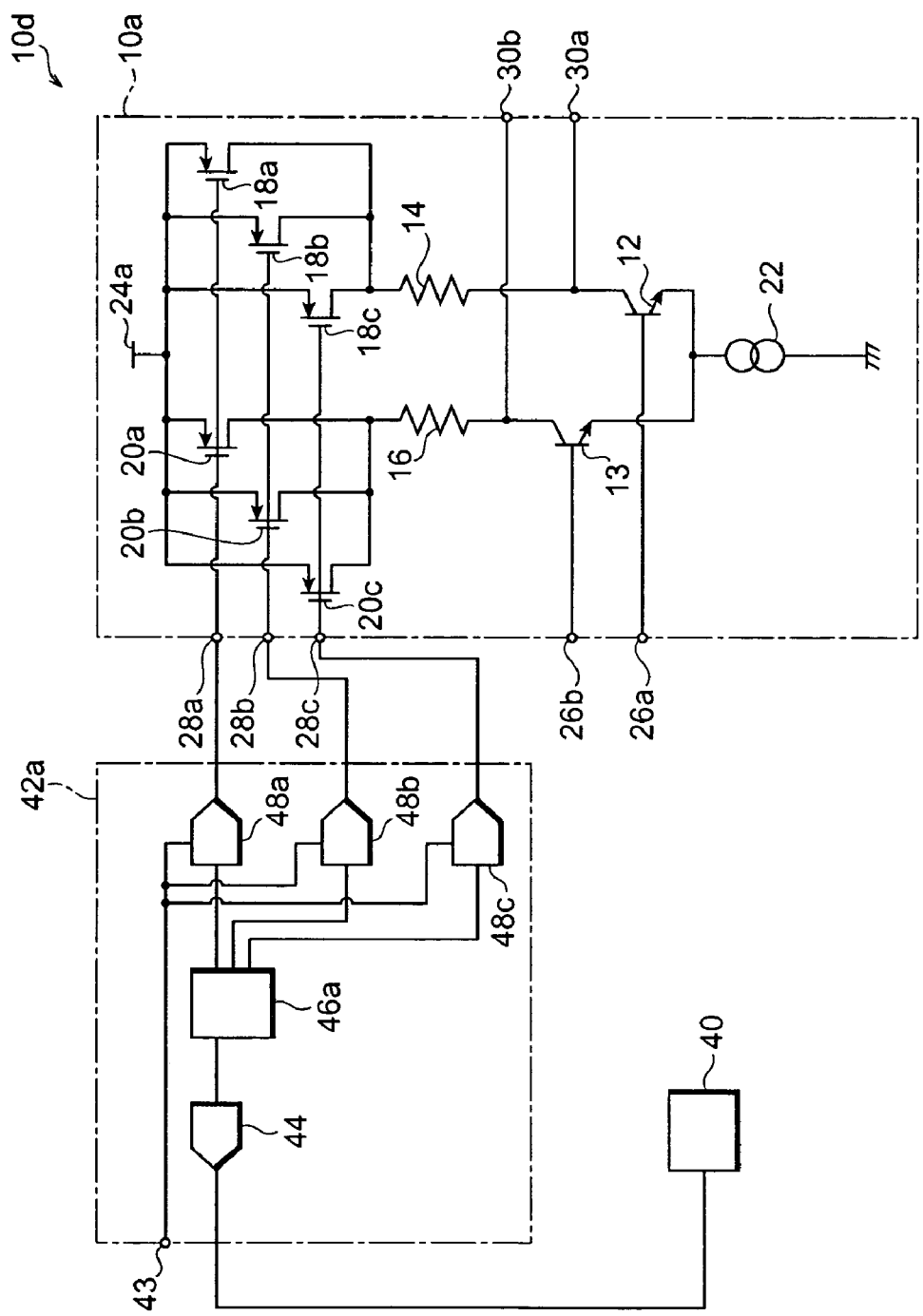
FIG. 6 is a circuit diagram of a driver according to the fifth embodiment of the present invention.

FIG. 6 is a diagram of the laser driver according to the fifth embodiment of the invention. The laser driver 10d provides a block 40 for monitoring the temperature and the controller 42a in addition to the configuration of the first laser driver 10a.

The laser driver 10d of the present embodiment is different from the previous driver shown in FIG. 5 in points, although the previous driver adjusts the output impedance thereof in analogue, the present driver 10d digitally varies the output impedance. Accordingly, the controller 42a provides tree output buffers, 48a to 48c.

When the controller 42a receives the control signal with the high level in the input terminal 43, the output buffers, 48a to 48c, turn high in the output thereof to turn off all transistors, 18a to 18c and 20a to 20c, which is equivalent to the configuration shown in FIG. 1 where the laser driver 10d is coupled with the laser diode in the DC mode. When the laser driver 10d is coupled with the laser diode 50 in the AC mode, the controller 42a receivers the control signal with the low level, the transistors, 18a to 18c and 20a to 20c, may be selected their on/off state by the outputs from the controller 42a. Preparing the look-up-table in the memory so as to set at least one of transistors, 18a to 18c or 20a to 20c, to turn on, the circuit shown in FIG. 3 may be realized to vary the output impedance of the laser driver 10d depending on the temperature of the laser diode 50.

Although the present invention is thus described as referring to preferred embodiments shown by the accompanying drawings, the present invention may have other various modifications in the embodiment. Therefore, the scope of the invention is intended to be limited solely by the scope of the appended claims.

What is claimed is:

1. A laser driver for driving a semiconductor laser diode, comprising:
a pair of transistors operated in a differential mode, each transistor having an output, one of outputs being coupled with an anode of the laser diode and the other output of the paired transistor being coupled with a cathode of the laser diode; and a pair of load circuits each connected between the output of the paired transistor and a power supply line, each load circuit including a resistor and a switch connected in series to the resistor, the resistor terminating each output of the paired transistor when the switch is turned on, wherein the switch in respective load circuits isolates the output of the paired transistor from the power supply line by being turned off when the output of the paired transistor is directly coupled with the laser diode, and the switch in respective load circuits connects the output of the paired transistor to the power supply line by being turned on when the output of the paired transistor is indirectly coupled with the laser diode via a capacitor, and wherein an on-resistance of the switch in respective load circuits is controlled depending on a temperature of the laser diode.

2. The laser driver according to claim 1, further comprising a sensor for monitoring the temperature of the laser diode and a controller for controlling the on-resistance of the switch based on the temperature of the laser diode.

3. A laser driver for driving a laser diode, comprising:
a pair of transistors operated in a differential mode, each transistor having an output, one of the outputs being coupled with an anode of the laser diode and the other output of the paired transistor being coupled with a cathode of the laser diode; and
a pair of load circuits each connected between the output of the paired transistor and a power supply line, each load circuit including a plurality of combination circuits connected in parallel to the output of the paired transistor, each combination circuit including a resistor and a switch connected in serial to the resistor, the resistor terminating each output of the paired transistor when the switch is turned on,
wherein the switch in respective combination circuits isolates the output of the paired transistor from the power supply line by being turned off when the output of the paired transistor is directly coupled with the laser diode, and the switch in respective combination circuits connects the output of the paired transistor to the power supply line by being turned on when the output of the paired transistor is indirectly coupled with the laser diode via a capacitor, and
wherein an on-resistance of the switch in respective combination circuits is controlled depending on a temperature of the laser diode.

4. The laser driver according to claim 3, further comprising a sensor for monitoring the temperature of the laser diode and a controller for defining a combination of the switches to be turned on based on the temperature of the laser diode.

5. The laser driver according to claim 1, wherein the switch is a MOS transistor.

6. A method for driving a semiconductor laser diode coupled with a laser driver that includes a pair of transistors operated in a differential mode and a pair of load units, each transistor having an output coupled with the laser diode and an input to receive a driving signal, each load unit including a resistor and a switch connected in series to the resistor and being connected between the output of the paired transistor and a power supply line, the method comprising steps of:
setting a condition of the load unit depending on a coupling configuration between the laser driver and the laser diode, when the coupling configuration is an indirectly coupling via a capacitor, turning on the switch and adjusting an on-resistance of the switch depending on a temperature of the laser diode; and
supplying the driving signals complementary to each other to respective inputs of the paired transistors.

7. The method according to claim 6, wherein the switch is turned off when the coupling configuration is directly coupling.

8. A method for driving a semiconductor laser diode coupled with a laser driver that includes a pair of transistors operated in a differential mode and a pair of load units, each transistor having an output coupled with the laser diode and an input to receive a driving signal, each load unit including a plurality of combination circuits including a resistor and a MOS transistor connected in series to the resistor and being connected between the output of the paired transistor and a power supply line, the method comprising steps of:
setting a condition of the load unit depending on a coupling configuration between the laser driver and the laser diode;
defining a combination of the MOS transistor to be turned on, when the coupling configuration is an indirectly coupling via a capacitor, and adjusting an on-resistance of the MOS transistor depending on a temperature of the laser diode; and
supplying the driving signals complementary to each other to respective inputs of the paired transistors.

9. The method according to claim 6, wherein the laser driver further includes a block for sensing the temperature of the laser diode.

10. The method according to claim 8, wherein the laser driver further includes a block for sensing the temperature of the laser diode, and
wherein the step for defining the combination of the MOS transistors to be turned on depends on the temperature of the laser diode.

11. The laser driver according to claim 3, wherein the switch is a MOS transistor.

* * * * *